(12) United States Patent
Liu et al.

(10) Patent No.: US 11,929,108 B2
(45) Date of Patent: Mar. 12, 2024

(54) MEMORY DETECTION METHOD, COMPUTER DEVICE AND STORAGE MEDIUM

(71) Applicant: CHANGXIN MEMORY TECHNOLOGIES, INC., Hefei (CN)

(72) Inventors: Dong Liu, Hefei (CN); Xikun Chu, Hefei (CN); Tianhao Diwu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 135 days.

(21) Appl. No.: 17/700,871

(22) Filed: Mar. 22, 2022

(65) Prior Publication Data

US 2023/0223070 A1     Jul. 13, 2023

(30) Foreign Application Priority Data

Jan. 12, 2022    (CN) .......................... 202210030575.2

(51) Int. Cl.
| | | |
|---|---|---|
| G11C 11/40 | (2006.01) | |
| G11C 11/4072 | (2006.01) | |
| G11C 11/408 | (2006.01) | |
| G11C 11/4091 | (2006.01) | |
| G11C 11/4096 | (2006.01) | |

(52) U.S. Cl.
CPC ...... *G11C 11/4085* (2013.01); *G11C 11/4072* (2013.01); *G11C 11/4091* (2013.01); *G11C 11/4096* (2013.01)

(58) Field of Classification Search
CPC ............ G11C 11/4085; G11C 11/4072; G11C 11/4091; G11C 11/4096; G11C 29/12005; G11C 29/021; G11C 29/025; G11C 29/028; G11C 29/50; G11C 29/50016; G11C 29/52; G11C 2029/0409; G11C 2029/1202; G11C 2029/5002; G11C 2029/5006; G11C 29/026; G11C 29/04

See application file for complete search history.

(56) References Cited

U.S. PATENT DOCUMENTS 5,953,246 A * 9/1999 Takashima .......... G11C 11/4085
365/227

FOREIGN PATENT DOCUMENTS

CN      112798940 A    5/2021

* cited by examiner

*Primary Examiner* — Mohammed A Bashar
(74) *Attorney, Agent, or Firm* — Cooper Legal Group, LLC

(57) ABSTRACT

Provided are a memory detection method, a computer device and a storage medium. The method includes: initializing all storage units in a storage unit array; determining a plurality of target wordlines, two adjacent target wordlines being provided with a plurality of interfering wordlines therebetween; turning on the target wordlines, and performing a write operation on storage units connected to the target wordlines; performing repeatedly turn-on and turn-off of the interfering wordlines for a plurality of times; and performing a read operation on the storage units connected to the target wordlines. A write operation is performed on the storage units connected to the interfering wordlines by means of forced current sinking.

16 Claims, 7 Drawing Sheets

MEMORY DETECTION METHOD, COMPUTER DEVICE AND STORAGE MEDIUM

CROSS-REFERENCE TO RELATED APPLICATION(S)

This application claims priority to Chinese patent application No. 202210030575.2, filed with the CNIPA on Jan. 12, 2022, the disclosure of which is hereby incorporated by reference in its entirety.

BACKGROUND

A Dynamic Random Access Memory (DRAM) is a semiconductor memory device commonly used in computers, and consists of many repetitive memory units. Each storage unit usually includes a capacitor and a transistor. The gate of the transistor is connected to a wordline, the drain of the transistor is connected to a bitline, and the source of the transistor is connected to the capacitor. A voltage signal on the wordline can control on or off of the transistor, and further reads data information stored in the capacitor through the bitline, or writes the data information into the capacitor for storage through the bitline.

As the DRAM manufacturing process is advancing and higher the storage density is increasing, more and more problems also appear in the DRAM manufacturing process. The problems are, such as, short circuit between two adjacent wordlines caused by by-product drop, a leakage current of a wordline, fracture of a metal wire, and structure problems caused by unqualified key size. These problems existing in the manufacturing process would easily cause failures of corresponding storage units, and thus need to be filtered out in the process of yield test. Otherwise, low product yield would be easily caused.

SUMMARY

The present application relates to the technical field of semiconductor device testing. The objective of the present application is to provide a memory detection method and an apparatus thereof, a computer device, and a computer-readable storage medium.

A first aspect of the present application provides a memory detection method, which includes the following operations. All storage units in a storage unit array are initialized. Target wordlines are determined, where two adjacent target wordlines are provided with interfering wordlines therebetween. The target wordlines are turned on, and a write operation is performed on storage units connected to the target wordlines. Turn-on and turn-off of the interfering wordlines are performed repeatedly for times. A read operation is performed on the storage units connected to the target wordlines. A write operation is performed on the storage units connected to the interfering wordlines by means of forced current sinking.

A second aspect of the present application provides a computer device, which includes a memory and a processor. The memory stores computer programs capable of being operated on the processor. When executing the computer programs, the processor implements steps of the memory detection method.

A third aspect of the present application provides a non-volatile computer-readable storage medium, which has program programs stored thereon. The program programs, when executed by a processor, implement steps of the memory detection method.

DETAILED DESCRIPTION

Figure 1:
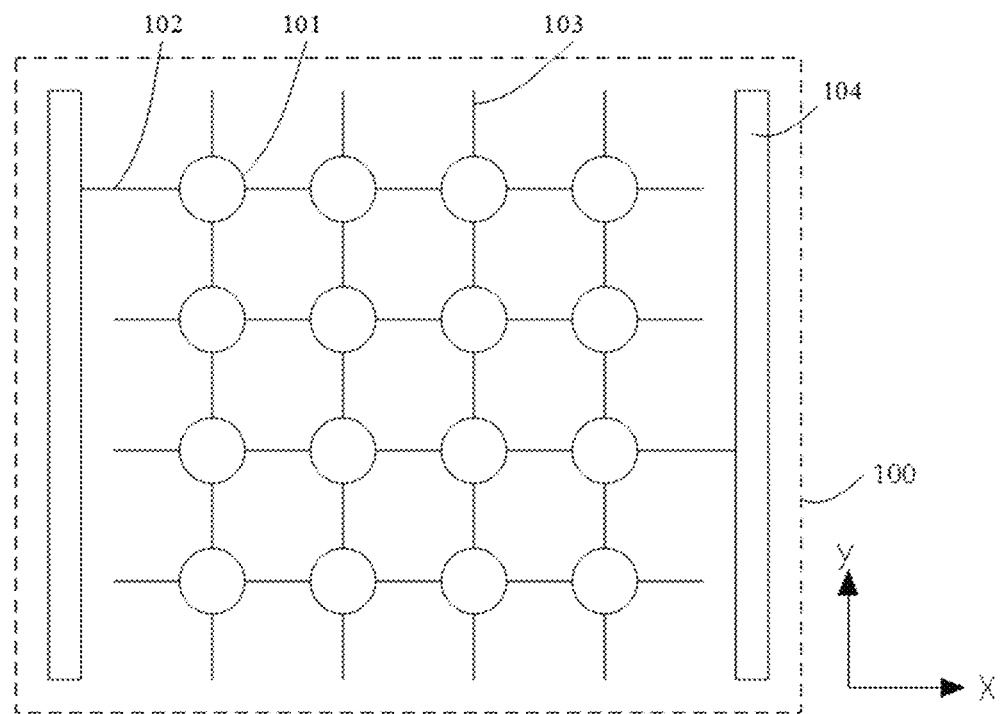
FIG. 1 is a schematic structural diagram of a memory according to a first implementation mode of the present application.

With reference to FIG. 1, a memory 100 includes multiple storage units 101, multiple discrete bitlines 102, and multiple discrete wordlines 130. Each bitline 102 is connected to a plurality of storage units 101; each wordline 103 is connected to a plurality of storage units 101; and each storage unit 101 is connected to a corresponding bitline 102 and a corresponding wordline 103. The memory 100 further includes multiple complementary bitlines (not marked). Each complementary bitline and a corresponding bitline 102 have electrical levels opposite in phase. The memory 100 further includes multiple sensing amplifiers 104. Each sensing amplifier 104 is electrically coupled with a bitline 102 and a complementary bitline; and the sensing amplifier 104 includes a power line for providing a low level voltage and a power line for providing a high level voltage. The wordlines 103 are distributed in parallel at intervals along an X-axis direction and extend along a Y-axis direction. The bitlines 102 are distributed in parallel at intervals along the Y-axis direction and extend along the X-axis direction. The X-axis direction is different from the Y-axis direction, that is, an included angle between the X-axis direction and the Y-axis direction is greater than 0° and less than 180°. In an embodiment, the X-axis is perpendicular to the Y-axis.

Figure 2:
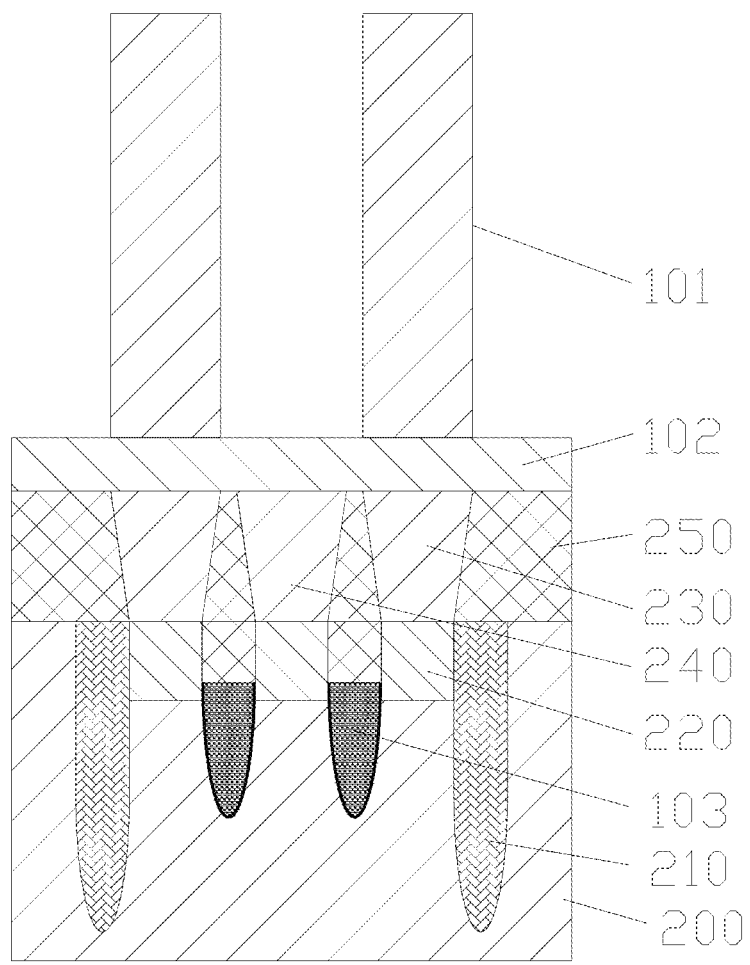
FIG. 2 is a schematic structural diagram of a memory according to a second implementation mode of the present application.

With reference to FIG. 2, a substrate 200 is provided. As an example, the substrate 200 may include, but are not limited to, a monocrystalline silicon substrate, a polycrystalline silicon substrate, a gallium nitride substrate, or a sapphire substrate. In this embodiment, the substrate 200 may be a monocrystalline silicon substrate or a polycrystalline silicon substrate. More preferably, the substrate 200 may further be a silicon substrate or a lightly doped silicon substrate, for example, an N-typed polycrystalline silicon substrate or a P-typed polycrystalline silicon substrate.

In some embodiments, with reference to FIG. 2, a trench isolation structure 210 extending into the substrate 200 is formed on the substrate 200. The trench isolation structure 210 may be specifically formed by making a deep isolation groove in the substrate 200 and filling the deep isolation groove with an isolation material. Specifically, the trench isolation structure 210 includes one or more of silicon nitride, silicon oxide, silicon oxynitride and other isolation materials. In this embodiment, the trench isolation structure 210 includes silicon oxide. Multiple independent regions are marked out on the substrate 200 through the trench isolation structure 210 to form active areas 220. The turn-on and turn-off of multiple active areas 220 may be controlled at the same time through the same wordline 103.

In an embodiment, a bitline connection pole 240 and a first connection pole 230 are formed on the active area 220. The bitline connection pole 240 and the first connection pole 230 are higher than the substrate 200. The bitline connection pole 240 is connected to the bitline 102. The first connection pole 230 is connected to the storage unit 101. There is an isolation medium layer 250 around the bitline connection pole 240 and the first connection pole 230. An insulation layer is formed on the surface of the wordline 103. The insulation layer may be silicon nitride (not shown in the drawings). It should be noted here that the wordline 103 in the embodiment of the present application is a buried structure, which is buried inside the substrate 200 and should not be seen in FIG. 1. In FIG. 1, the wordline 103 is marked to facilitate understanding of the shape and position of the buried wordline 103 in the memory 100.

Figure 3:
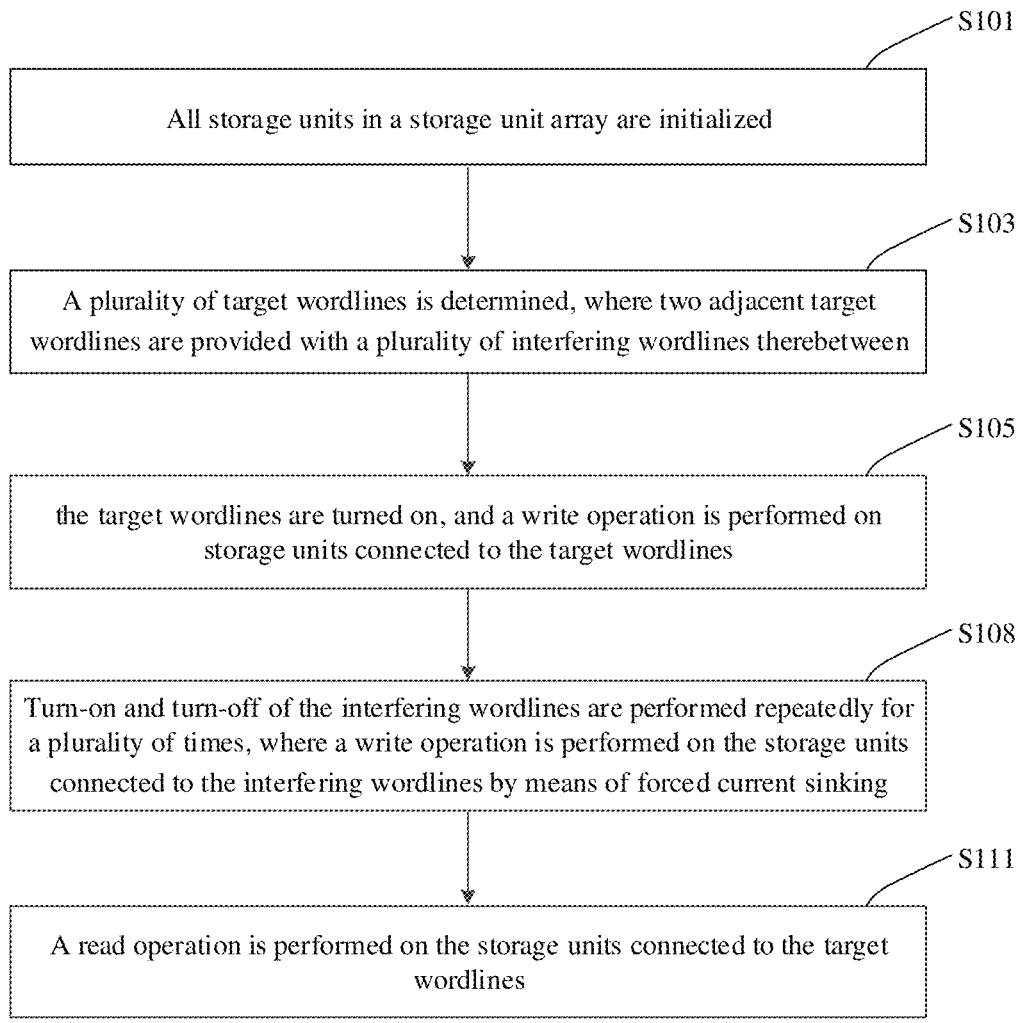
FIG. 3 is a flowchart of a memory detection method according to a third implementation mode of the present application.

With reference to FIG. 3, a first aspect of an embodiment of the present application provides a memory detection method, which may include the following operations.

At S101, all storage units in a storage unit array are initialized. The initialization of the storage units may activate the storage units, and in this way, data may be written into the storage units.

At S103, a plurality of target wordlines is determined, where two adjacent target wordlines are provided with a plurality of interfering wordlines therebetween.

At S105, the target wordlines are turned on, and a write operation is performed on storage units connected to the target wordlines.

At S108, turn-on and turn-off of the interfering wordlines are performed repeatedly for a plurality of times.

At S111, a read operation is performed on the storage units connected to the target wordlines.

In some embodiments, S108 in which turn-on and turn-off of the interfering wordlines are performed repeatedly for a plurality of times includes: a write operation is performed on the storage units connected to the interfering wordlines by means of forced current sinking.

In the embodiments of the present application, the write operation is performed on the storage units connected to the target wordlines, data is written into the storage units connected to the interfering wordlines by means of forced current sinking, then the interfering wordlines are continuously turned on and off to interfere the content written into the storage units connected to the target wordlines. This test measure can magnify a voltage difference between two adjacent wordlines with a potential leakage or short circuit, so as to detect the double storage unit failure caused by two storage units partially coming into contact with each other due to a difference in manufacturing process, thus avoiding the reduction of product yield.

It is forced to write "0" or "1" into the storage units connected to three interfering wordlines that need to be turned on and off repeatedly (stressed) by means of forced current sinking, which can avoid the interference of other factors. During current sinking, it is possible to effectively switch to the interfering wordlines that need to execute the stress operation, thereby eliminating the impact to the writing data into the storage units connected to the target wordlines.

In some embodiments, before S108 in which turn-on and turn-off of the interfering wordlines are performed repeatedly for a plurality of times, the method further includes the following operation.

At S106, the storage unit array is refreshed after the write operation is performed on the storage units connected to the target wordlines.

In some embodiments, after S106 in which the storage unit array is refreshed after the write operation is performed on the storage units connected to the target wordlines, the method further includes the following operation.

At S107, voltage regulation is performed on all the storage units in the storage unit array to increase a voltage difference between the storage units connected to the interfering wordlines and the storage units connected to the target wordlines.

In some embodiments, after S108 in which turn-on and turn-off of the interfering wordlines are performed repeatedly for a plurality of times, the method further includes the following operations.

At S109, a voltage at upper plates of capacitors of all the storage units in the storage unit array is restored to a preset default value, and turn-on of a sensing amplifier is maintained.

In some embodiments, before S111 in which the read operation is performed on the storage units connected to the target wordlines, the method further includes the following operations.

At S110, the storage unit array is refreshed after the voltage at the upper plates of the capacitors of all the storage units in the storage unit array is restored to the preset default value and turn-on of the sensing amplifier is maintained.

In some embodiments, S105 in which the write operation is performed on the storage units connected to the target wordlines includes the following operations. The write operation with data equaling to 0 or 1 is performed on the storage units connected to the target wordlines. The data is written into the storage units connected to the target wordlines one by one in a first sequence mode.

In some embodiments, S105 in which the write operation is performed on the storage units connected to the target wordlines further includes the following operations. One target wordline of the target wordlines is turned on. The data is written into the storage unit connected to the turn-on target wordline. After writing the storage unit connected to the turn-on target wordline is finished, the turn-on target wordline is turned off. Then, one next target wordline is further turned on and the write operation is performed, until the storage units connected to all the target wordlines are written.

In some embodiments, S111 in which the read operation is performed on the storage units connected to the target wordlines includes the following operations. One target wordline of the target wordlines is turned on. The storage unit connected to the turn-on target wordline is read. After reading the storage unit connected to the turn-on target wordline is finished, the turn-on target wordline is turned off. Then, one next target wordline is further turned on and the read operation is performed, until the storage units connected to all the target wordlines are read.

In some embodiments, the two adjacent target wordlines are provided with three interfering wordlines therebetween.

In some embodiments, S107 in which voltage regulation is performed on all the storage units in the storage unit array to increase the voltage difference between the storage units connected to the interfering wordlines and the storage units connected to the target wordlines includes the following operations. When data for performing the write operation on the storage units connected to the target wordlines is 0, the voltage at upper plates of capacitors of all the storage units in the storage unit array is regulated to a first voltage (VSS). When the data for performing the write operation on the storage units connected to the target wordlines is 1, the voltage at the upper plates of the capacitors of all the storage units in the storage unit array is regulated to a second voltage (VARY). The first voltage is less than the second voltage.

In an embodiment provided in the present application, the memory includes multiple wordlines, and the multiple wordlines include target wordlines and interfering wordlines. It can be understood that, in this embodiment, two adjacent target wordlines may be provided with three interfering wordlines therebetween. It should be noted that the detection method provided by the embodiment of the present application includes, but is not limited to, the arrangement mode described above, that is, a certain number of interfering wordlines may be arranged between two adjacent target wordlines as required.

Figure 4:
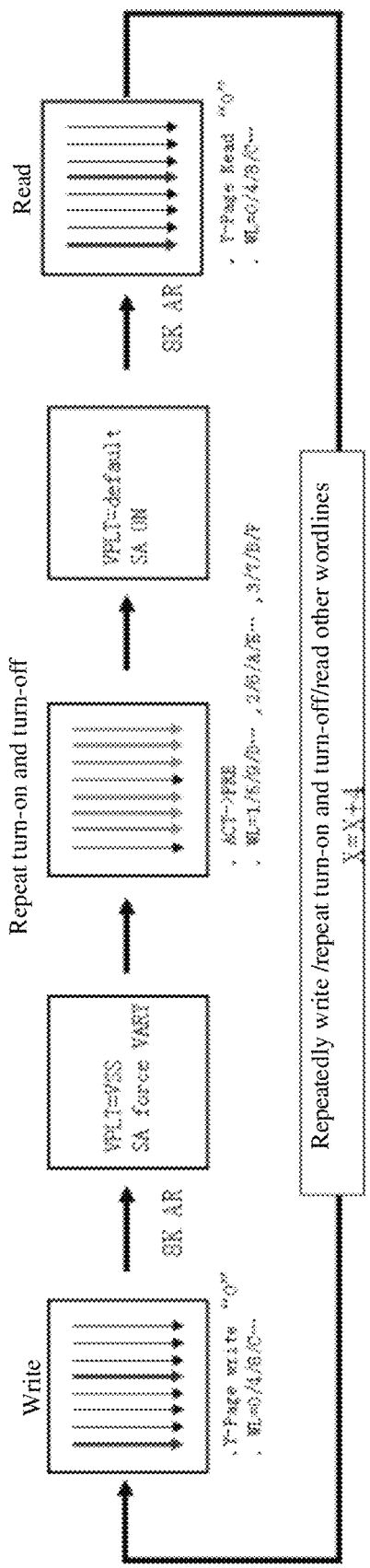
FIG. 4 is a schematic diagram of processing steps of a memory detection method according to a fourth implementation mode of the present application.

With reference to FIG. 4, a detection method provided by an embodiment of the present application includes the following operations:

At S201, all storage units in a storage unit array are initialized to activate the storage units.

At S203, a plurality of target wordlines is determined, where two adjacent target wordlines are provided with a plurality of interfering wordlines therebetween. Based on the arrangement mode that two adjacent target wordlines may be provided with three interfering wordlines therebetween, the interfering wordlines may be numbered, and the numbering meets a conditional formula: X=X+4. Based on this conditional formula, the target wordlines may be numbered as 0/4/8/C . . . respectively, and the interfering wordlines may be numbered as 1/5/9/D . . . , 2/6/A/E . . . , or 3/7/B/F . . . , respectively.

At S205, the target wordlines are turned on, and a write operation is performed on storage units connected to the target wordlines. In this embodiment, data is written into the storage unit connected to wordlines numbered as 0/4/8/C . . . in a Y-page write mode, and the written data is 0. For example, one target wordline of the target wordlines may be first turned on; the serial number of the target wordline is 0; data (0) is written into the storage unit connected to the turn-on target wordline (numbered 0) according to a Y-direction sequence in turn. After writing the storage unit connected to the turn-on target wordline (numbered 0) is finished, the turn-on target wordline (numbered 0) is turned off. Then one next target wordline (for example, this target wordline is numbered 4) is turned on and the write operation (the written data is 0) is performed, until the storage units connected to all the target wordlines are written.

At S206, the storage unit array is refreshed after the write operation is performed on the storage units connected to the target wordlines. In some embodiments, refreshing may be conducted according to 8K. 8K refers to that, according to a preset mode of refreshing N storage units at one time, i.e., in a case of a total number of the storage units to be 8000×N, all storage units are refreshed through 8000 times, until the storage unit array is completely refreshed once.

At S207, voltage regulation is performed on all the storage units in the storage unit array to increase a voltage difference between the storage units connected to the interfering wordlines and the storage units connected to the target wordlines. In some embodiments, the voltage (VPLT) at upper plates of capacitors of all the storage units in the storage unit array is regulated to a first voltage (VSS). For example, the first voltage (VSS) may be 0 V.

At S208, turn-on and turn-off of the interfering wordlines are performed repeatedly for a plurality of times. At this time, forced current sinking may be used, for example, an external power supply is used to write 0/1 into the storage unit connected to the interfering wordline, which is faster than a general test mode, i.e., the test mode which needs to regulate the voltage step by step to achieve the target value, and also effectively makes up for interferences of insufficient writing of an internal power supply and other factors.

At S209, a voltage at upper plates of capacitors of all the storage units in the storage unit array is restored to a preset default value (the default value is 0.5 V), and turn-on of a sensing amplifier is maintained. This can avoid unnecessary influences caused by other factors.

The voltage at a lower plate of a capacitor of the storage unit connected to the interfering wordline numbered 1 is driven to 1.0 V by means of forced current sinking; the voltage at an upper plate of the capacitor of the storage unit connected to the interfering wordline is reduced to 0 V through voltage regulation. At this time, the maximum voltage difference between the upper and lower plates of the capacitor of the storage unit connected to the interfering wordline numbered 1 is 1.0-0=1.0 V. After the voltage (VPLT) at an upper plate of a capacitor of the storage unit connected to the target wordline numbered 0 is restored to the preset default value (default), i.e., the default value is 0.5 V, and the written data is 0, the voltage difference between the upper and lower plates of the capacitor of the storage unit connected to the target wordline numbered 0 is 0-0.5=−0.5 V. Therefore, the maximum leakage voltage difference between the storage unit connected to the interfering wordline numbered 0 and the storage unit connected to the target wordline numbered 1 is 1.0-(−0.5)=1.5 V. Similarly, the steps described above are performed on the storage unit connected to the interfering wordline numbered 2 or 3, i.e., an external power supply is used to write 0/1, so that the maximum leakage voltage difference between the storage units connected to adjacent target wordlines is 1.5 V, and turn-on and turn-off are repeatedly conducted for a plurality of times. This repetition can interfere the storage unit connected to the target wordline, thereby effectively testing the storage unit with potential failures due to short circuit or leakage conditions of adjacent wordlines caused by the manufacturing process differences.

At S210, the storage unit array is refreshed again after the voltage at the upper plates of the capacitors of all the storage units in the storage unit array is restored to the preset default value, and turn-on of the sensing amplifier is maintained. In some embodiments, refreshing may be conducted according to 8K. 8 K refers to that, according to a preset mode of refreshing N storage units at one time, i.e., in a case of a total number of the storage units to be 8000×N, all storage units are refreshed through 8000 times, until the storage unit array is completely refreshed once again.

At S211, a read operation is performed on the storage units connected to the target wordlines. In this embodiment, data is read out from the storage units connected to wordlines numbered as 0/4/8/C . . . in a Y-Page Read mode. For example, one of the target wordlines may be first turned on; the serial number of the target wordline is 0; the storage unit connected to the turn-on target wordline (numbered 0) is read according to a Y-direction sequence in turn; after reading the storage unit connected to the turn-on target wordline is finished, the turn-on target wordline (numbered 0) is turned off; then a next target wordline is turned on; the serial number of the target wordline is 4; the read operation is performed (the storage data of the storage unit in a normal state is 0), until the storage units connected to all the target wordlines are read. A sensing amplifier (SA) is used for reading the data stored in the storage unit connected to the target wordline. At this time, if the data stored in the storage unit connected to the target wordline is read out as 0, it is determined that the storage unit connected to the target wordline is in a normal state; if the data is read out as 1, it is determined that the storage unit connected to the target wordline has a failure caused by interferences.

Operations 203 to 211 described above are repeated and may be circulated to detect the storage units connected to other wordlines. In this way, all storage units in the storage unit array can be covered, and therefore, it can be determined whether a failure caused by interferences exists for all storage units.

Figure 5:
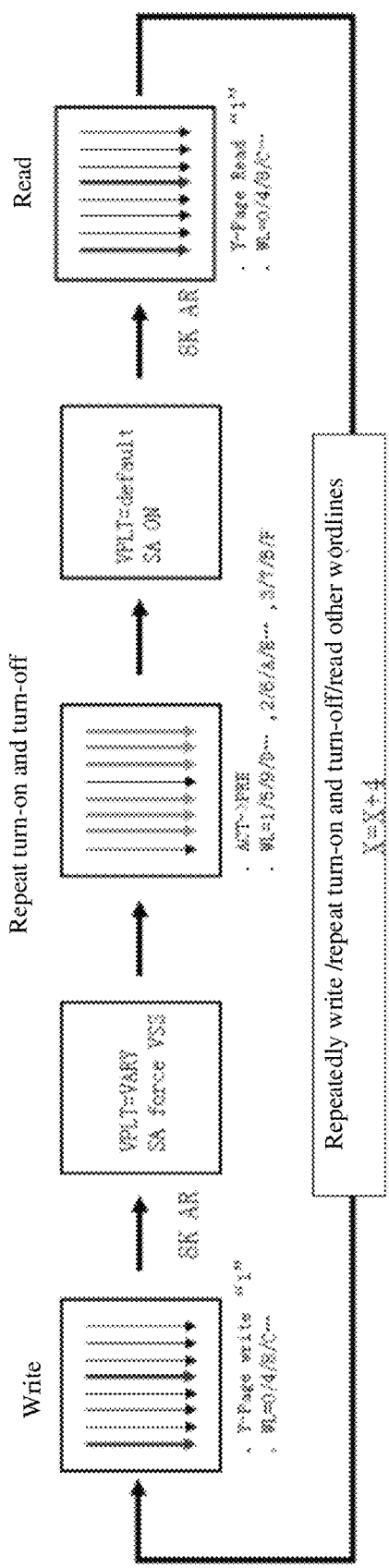
FIG. 5 is a schematic diagram of processing steps of a memory detection method according to a fifth implementation mode of the present application.

With reference to FIG. 5, a detection method provided by an embodiment of the present application includes the following operations.

At S301, all storage units in a storage unit array are initialized.

At S303, a plurality of target wordlines is determined, where two adjacent target wordlines are provided with a plurality of interfering wordlines therebetween. Based on the arrangement mode where three interfering wordlines may be set between two adjacent target wordlines, the interfering wordlines may be numbered, and the numbering meets the conditional formula: $X=X+4$. Based on the conditional formula, the target wordlines may be numbered as 0/4/8/C . . . respectively; and the interfering wordlines may be numbered as 1/5/9/D . . . , 2/6/A/E . . . , or 3/7/B/F . . . , respectively.

At S305, the target wordlines are turned on, and a write operation is performed on storage units connected to the target wordlines. In this embodiment, data is written into the storage unit connected to wordlines numbered as 0/4/8/C: . . . in a Y-page write mode, and the written data is 1. For example, one target wordline of the target wordlines may be first turned on; the serial number of the target wordline is 0; data (1) is written into the storage unit connected to the turn-on target wordline (numbered 0) according to a Y-direction sequence in turn. After writing the storage unit connected to the turn-on target wordline is finished, the turn-on target wordline (numbered 0) is turned off. Then one next target wordline is (for example, this target wordline is numbered 4) turned on and the write operation (the written data is 1) is performed until the storage units connected to all the target wordlines are written.

At S306, the storage unit array is refreshed after the write operation is performed on the storage units connected to the target wordlines. In some embodiments, refreshing may be conducted according to 8K. 8K refers to that, according to a preset mode of refreshing N storage units at one time, i.e., in a case of a total number of the storage units to be 8000×N, all storage units are refreshed through 8000 times, until the storage unit array is completely refreshed once.

At S307, voltage regulation is performed on all the storage units in the storage unit array to increase a voltage difference between the storage units connected to the interfering wordlines and the storage units connected to the target wordlines. In some embodiments, the voltage at upper plates of capacitors of all the storage units in the storage unit array is regulated to a second voltage (VARY). For example, the second voltage (VARY) may be 1 V.

At S308, turn-on and turn-off of the interfering wordlines are performed repeatedly for a plurality of times. At this time, forced current sinking may be used, for example, an external power supply is used to write 0/1 into the storage unit connected to the interfering wordline, which is faster than a general test mode, i.e., the test mode which needs to regulate the voltage step by step to achieve the target value, and also effectively makes up for interferences of insufficient writing of an internal power supply and other factors.

At S309, a voltage at upper plates of capacitors of all the storage units in the storage unit array is restored to a preset default value (the default value is 0.5 V), and turn-on of a sensing amplifier is maintained. This can avoid unnecessary influences caused by other factors.

The voltage at a lower plate of a capacitor of the storage unit connected to the interfering wordline numbered 1 is driven to 0 V by means of forced current sinking; the voltage at an upper plate of the capacitor of the storage unit connected to the interfering wordline is reduced to 0 V through voltage regulation. At this time, the minimum voltage difference between the upper and lower plates of the capacitor of the storage unit connected to the interfering wordline numbered 1 is 0-1.0=−1.0 V. After the voltage (VPLT) at an upper plate of a capacitor of the storage unit connected to the target wordline numbered 0 is restored to the preset default value (default), i.e., the default value (default) is 0.5 V, and the written data is 1, the voltage difference between the upper and lower plates of the capacitor of the storage unit connected to the target wordline numbered 0 is 1-0.5=0.5 V. Therefore, the maximum leakage voltage difference between the storage unit connected to the interfering wordline numbered 0 and the storage unit connected to the target wordline numbered 1 is 0.5-(−1.0)=1.5 V. Similarly, the steps described above are performed on the storage unit connected to the interfering wordline numbered 2 or 3, i.e., an external power supply is used to write 0/1, so that the maximum leakage voltage difference between the storage units connected to adjacent target wordlines is 1.5 V, and turn-on and turn-off are repeatedly conducted for a plurality of times. This repetition can interfere the storage unit connected to the target wordline, thereby effectively testing the storage unit with potential failures due to short circuit or leakage conditions of adjacent wordlines caused by the manufacturing process differences.

At S310, the storage unit array is refreshed again after the voltage at the upper plates of the capacitors of all the storage units is restored to the preset default value, and turn-on of the sensing amplifier is maintained. In some embodiments, refreshing may be conducted according to 8K. 8K refers to that, according to a preset mode of refreshing N storage units at one time, i.e., in a case of a total number of the storage units to be 8000×N, all storage units are refreshed through 8000 times, until the storage unit array is completely refreshed once again.

At S311, a read operation is performed on the storage units connected to the target wordlines. In this embodiment, data is read out from the storage units connected to wordlines numbered as 0/4/8/C . . . in a Y-Page Read mode. For example, one of the target wordlines may be first turned on; the serial number of the target wordline is 0; the storage unit connected to the turn-on target wordline (numbered 0) is read according to a Y-direction sequence in turn; after reading the storage unit connected to the turn-on target wordline is finished, the turn-on target wordline (numbered 0) is turned off; then a next target wordline is turned on; the serial number of the target wordline is 4; the read operation is performed (the storage data of the storage unit in a normal state is 1), until the storage units connected to all the target wordlines are read. A sensing amplifier (SA) is used for reading the data stored in the storage unit connected to the target wordline. At this time, if the data stored in the storage unit connected to the target wordline is read as 1, it is determined that the storage unit connected to the target wordline is in a normal state; if the data is read out as 0, it is determined that the storage unit connected to the target wordline is failed due to interferences.

Operations 303 to 311 described above are repeated and may be circulated to detect the storage units connected to other wordlines. In this way, all storage units in the storage unit array can be covered, and therefore, it can be determined whether a failure caused by interferences exists for all storage units.

Figure 6:
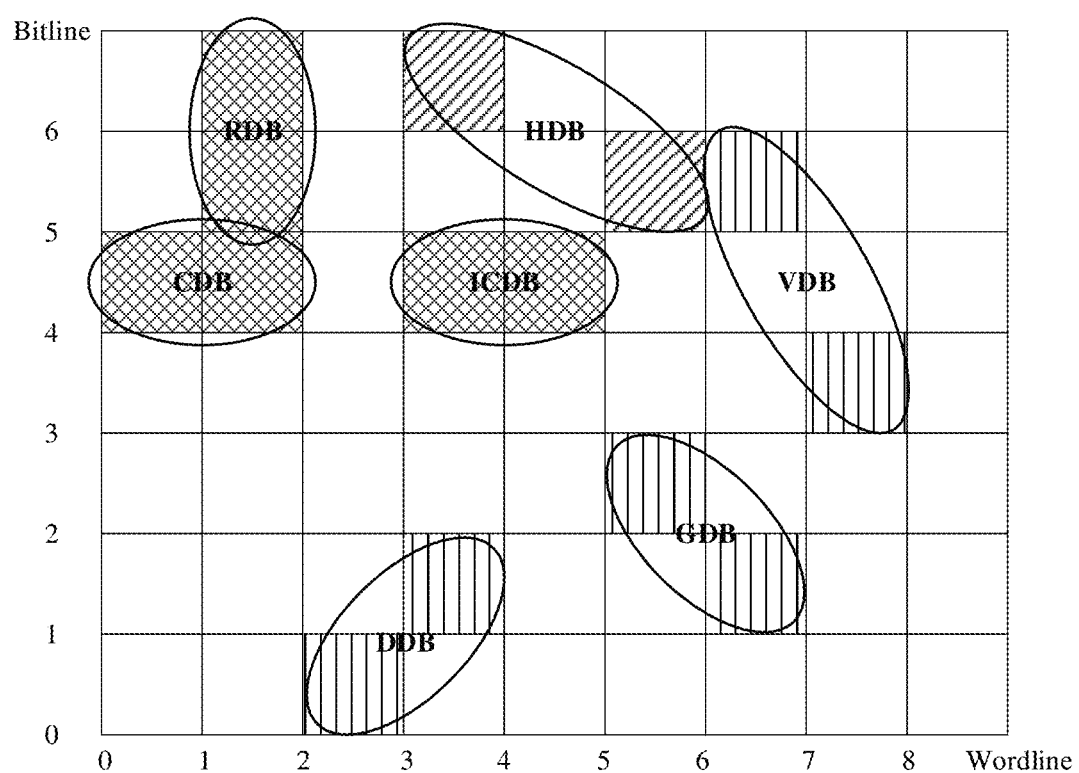
FIG. 6 is a schematic diagram of a situation in which a memory is detected to have a double storage unit failure according to a sixth implementation mode of the present application.

All storage units in the storage unit array are detected by performing the aforementioned memory detection method provided by the embodiment of the present application. With reference to FIG. 6, there are cases for several types of double storage unit (Twin Bit) failures:

1. ROW DOUBLE BITS (RDB):

In the same wordline (X-direction), the double storage units connected to two adjacent bitlines in the Y-direction fail.

2. COLUMN DOUBLE BITS (CDB, same active area (AA)):

In the same bitline and the same active area (AA), the double storage units connected to two wordlines adjacent in the Y-direction fail.

3. ISO COLUMN DOUBLE BITS (ICDB, different active areas (AA)):

In the same bitline (Y-direction) and different active areas (AA), the double storage unit connected to two wordlines adjacent in the X-direction fails.

4. GATE DOUBLE BITS (GDB):

In the same bitline (Y-direction) and a diagonal direction as shown in FIG. 6, the mantissas of two wordlines may be a combination of odd and even numbers, and may also be a combination of even and odd numbers; and the double storage units connected to the two wordlines fail.

5. HORIZONTAL DOUBLE BITS (HDB):

Two storage units are located at adjacent positions in the vertical direction (parallel to the bitline direction), and have a failure of double storage units which are adjacent in the Y direction and are connected to two wordlines with a difference of 2 in the X direction.

6. VERTICAL DOUBLE BITS (VDB):

Two storage units are located at adjacent positions in the horizontal direction (parallel to the wordline direction) and have a failure of double storage units which are adjacent in the X direction and are connected to two wordlines with a difference of 2 in the Y direction.

7. DIAGONAL DOUBLE BITS (DDB):

In the same bitline (Y-direction) and a diagonal direction as shown in FIG. 6, the mantissas of two wordlines may be a combination of odd and even numbers, and may also be a combination of even and odd numbers; and double storage units connected to the two wordlines fail.

To avoid the interference of other factors, it is forced to write "0" or "1" into the storage units connected to three interfering wordlines that need to be turned on and off (stressed) repeatedly by means of forced current sinking. During current sinking, it is possible to effectively switch to the interfering wordlines that need to execute the stress operation, thereby eliminating the impact to the writing data into the storage units connected to the target wordline. Then the interfering wordlines are continuously turned on and off to interfere the content written into the storage units connected to the target wordlines. The test measure can magnify a voltage difference between two adjacent wordlines with a potential leakage or short circuit, so as to detect the double storage unit failure caused by two storage units partially coming into contact with each other due to a difference in manufacturing process, and effectively eliminate effective products with potential Twin Bit failures, thus avoiding the reduction of product yield. Hence, the reduction of product yield is avoided. With the subsequent mass production of the product, the cost of manual operation is simplified, and the product yield of the posterior test is improved. Moreover, the production cost is reduced, and the efficiency of on-line test is improved.

Figure 7:
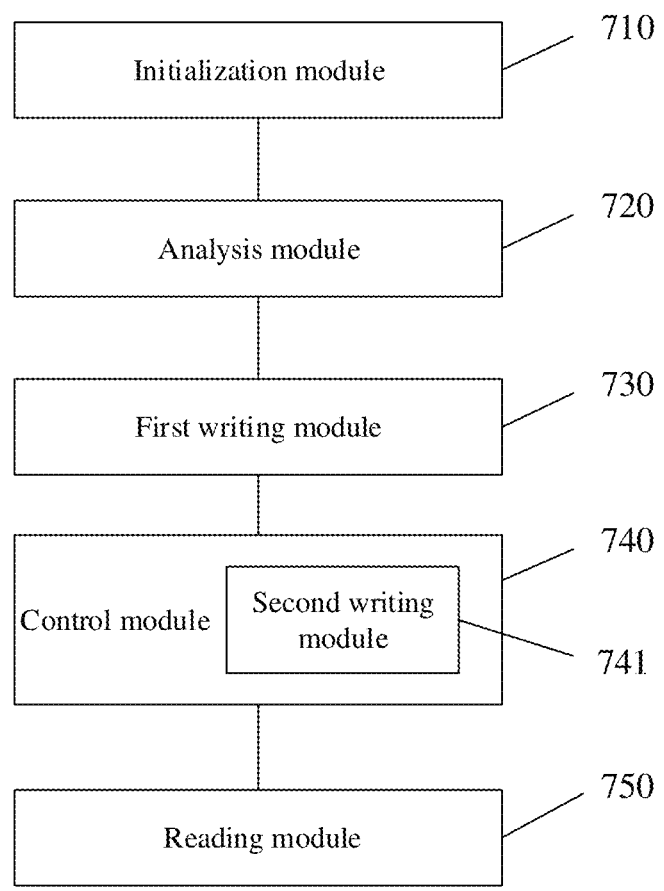
FIG. 7 is a schematic structural diagram of a memory detection apparatus according to a seventh implementation mode of the present application.

A second aspect of the present application provides a memory detection apparatus, with reference to FIG. 7, which includes: an initialization module 710, configured to initialize all storage units in a storage unit array; an analysis module 720, configured to determine a plurality of target wordlines, where two adjacent target wordlines are provided with a plurality of interfering wordlines therebetween; a first writing module 730, configured to turn on the target wordlines, and perform a write operation on storage units connected to the target wordlines; a control module 740, configured to perform repeatedly turn-on and turn-off of the interfering wordlines for a plurality of times; and a reading module 750, configured to perform a read operation on the storage units connected to the target wordlines. The control module 740 includes a second writing module 741. The second writing module 741 is configured to perform a write operation on the storage units connected to the interfering wordlines by means of forced current sinking.

In some embodiments, the memory detection apparatus further includes: a first refreshing module, configured to refresh the storage unit array after the write operation is performed on the storage units connected to the target wordlines.

In some embodiments, the memory detection apparatus further includes: a first regulation module, configured to perform voltage regulation on all the storage units in the storage unit array to increase a voltage difference between the storage units connected to the interfering wordlines and the storage units connected to the target wordlines.

In some embodiments, the memory detection apparatus further includes: a second regulation module, configured to restore a voltage at upper plates of capacitors of all the storage units in the storage unit array to a preset default value, and maintain turn-on of a sensing amplifier.

In some embodiments, the memory detection apparatus further includes: a second refreshing module, configured to refresh the storage unit array after the voltage at the upper plates of the capacitors of all the storage units in the storage unit array is restored to the preset default value, and the turn-on of the sensing amplifier is maintained.

A third aspect of the present application provides a computer device, which includes a memory and a processor. The memory stores computer programs capable of being operated on the processor. When executing the computer programs, the processor implements steps of the memory detection method.

A fourth aspect of the present application provides a computer-readable storage medium, which has program programs stored thereon. The program programs, when executed by a processor, implement steps of the memory detection method.

It should be understood that the specific implementation modes of the present application described above are only used to exemplarily illustrate or explain the principles of the present application, and does not constitute limit to the present application. Hence, any modification, equivalent replacement, improvement and the like made within the spirit and scope of the present application shall fall within the protection scope of the present application. In addition, the claims annexed to the present application are intended to cover all variations and modification examples falling within the scopes and boundaries of the attached claims or equivalent forms of such scopes and boundaries.

What is claimed is:

1. A memory detection method, comprising:
   initializing all storage units in a storage unit array;
   determining a plurality of target wordlines, wherein two adjacent target wordlines of the plurality of target wordlines are provided with a plurality of interfering wordlines therebetween;
   turning on the plurality of target wordlines, and performing a write operation on storage units connected to the plurality of target wordlines;
   performing repeatedly turn-on and turn-off of the plurality of interfering wordlines for a plurality of times; and
   performing a read operation on the storage units connected to the plurality of target wordlines;
   wherein a write operation is performed on storage units connected to the plurality of interfering wordlines by means of forced current sinking;
   wherein before the performing repeatedly turn-on and turn-off of the plurality of interfering wordlines for a plurality of times, the method further comprises:
     refreshing the storage unit array after performing the write operation on the storage units connected to the plurality of target wordlines; and
     performing voltage regulation on all the storage units in the storage unit array to increase a voltage difference between the storage units connected to the plurality of interfering wordlines and the storage units connected to the plurality of target wordlines.

2. The method of claim 1, after the performing repeatedly turn-on and turn-off of the plurality of interfering wordlines for a plurality of times, further comprising:
   restoring a voltage at upper plates of capacitors of all the storage units in the storage unit array to a preset default value, and maintaining turn-on of a sensing amplifier.

3. The method of claim 2, before the performing a read operation on the storage units connected to the plurality of target wordlines, further comprising:
   refreshing the storage unit array after restoring the voltage at the upper plates of the capacitors of all the storage units in the storage unit array to the preset default value, and maintaining the turn-on of the sensing amplifier.

4. The method of claim 1, wherein the performing the write operation on the storage units connected to the plurality of target wordlines comprises:
   performing the write operation with data equaling to 0 or 1 on the storage units connected to the plurality of target wordlines; and
   writing the data into the storage units connected to the plurality of target wordlines one by one in a first sequence mode.

5. The method of claim 4, wherein the performing the write operation on the storage units connected to the plurality of target wordlines further comprises:
   turning on one target wordline of the plurality of target wordlines, writing the data into the storage unit connected to the turned-on target wordline, and turning off the turned-on target wordline after writing the data into the storage unit connected to the turned-on target wordline is finished; and
   then further turning on one next target wordline of the plurality of target wordlines and performing the write operation, until the storage units connected to all the plurality of target wordlines are written.

6. The method of claim 4, wherein the performing a read operation on the storage units connected to the plurality of target wordlines comprises:
   turning on one target wordline of the plurality of target wordlines, reading the storage unit connected to the turned-on target wordline, and turning off the turned-on target wordline after reading the storage unit connected to the turned-on target wordline is finished; then further turning on one next target wordline of the plurality of target wordlines and performing the read operation, until the storage units connected to all the plurality of target wordlines are read.

7. The method of claim 1, wherein the two adjacent target wordlines are provided with three interfering wordlines therebetween.

8. The method of claim 4, wherein the performing voltage regulation on all the storage units in the storage unit array to increase a voltage difference between the storage units connected to the plurality of interfering wordlines and the storage units connected to the plurality of target wordlines comprises:
   in a case where data for performing the write operation on the storage units connected to the plurality of target wordlines is 0, regulating a voltage at upper plates of capacitors of all the storage units in the storage unit array to a first voltage; and
   in a case where the data for performing the write operation on the storage units connected to the plurality of target wordlines is 1, regulating the voltage at the upper plates of the capacitors of all the storage units in the storage unit array to a second voltage;
   wherein the first voltage is less than the second voltage.

9. A computer device, comprising a memory and a processor, the memory storing computer programs configured to be operated on the processor, wherein when executing the computer programs, the processor is configured to:
   initialize all storage units in a storage unit array;
   determine a plurality of target wordlines, wherein two adjacent target wordlines of the plurality of target wordlines are provided with a plurality of interfering wordlines therebetween;
   turn on the plurality of target wordlines, and perform a write operation on storage units connected to the plurality of target wordlines;
   perform repeatedly turn-on and turn-off of the plurality of interfering wordlines for a plurality of times; and
   perform a read operation on the storage units connected to the plurality of target wordlines;
   wherein a write operation is performed on storage units connected to the plurality of interfering wordlines by means of forced current sinking;
   wherein the processor is further configured to:
   refresh the storage unit array after performing the write operation on the storage units connected to the plurality of target wordlines; and
   perform voltage regulation on all the storage units in the storage unit array to increase a voltage difference between the storage units connected to the plurality of interfering wordlines and the storage units connected to the plurality of target wordlines.

10. The computer device of claim 9, wherein the processor is further configured to:
restore a voltage at upper plates of capacitors of all the storage units in the storage unit array to a preset default value, and maintain turn-on of a sensing amplifier.

11. The computer device of claim 10, wherein the processor is further configured to:
refresh the storage unit array after restoring the voltage at the upper plates of the capacitors of all the storage units in the storage unit array to the preset default value, and maintain the turn-on of the sensing amplifier.

12. The computer device of claim 9, wherein the processor is specifically configured to:
perform the write operation with data equaling to 0 or 1 on the storage units connected to the plurality of target wordlines; and
write the data into the storage units connected to the plurality of target wordlines one by one in a first sequence mode.

13. The computer device of claim 12, wherein the processor is specifically configured to:
turn on one target wordline of the plurality of target wordlines, write the data into the storage unit connected to the turned-on target wordline, and turn off the turned-on target wordline after writing the data into the storage unit connected to the turned-on target wordline is finished; and
then further turn on one next target wordline of the plurality of target wordlines and perform the write operation, until the storage units connected to all the plurality of target wordlines are written.

14. The computer device of claim 12, wherein the processor is specifically configured to:
turn on one target wordline of the plurality of target wordlines, read the storage unit connected to the turned-on target wordline, and turn off the turned-on target wordline after reading the storage unit connected to the turned-on target wordline is finished; then further turn on one next target wordline of the plurality of target wordlines and perform the read operation, until the storage units connected to all the plurality of target wordlines are read.

15. The computer device of claim 9, wherein the two adjacent target wordlines are provided with three interfering wordlines therebetween,
wherein the processor is specifically configured to:
in a case where data for performing the write operation on the storage units connected to the plurality of target wordlines is 0, regulate a voltage at upper plates of capacitors of all the storage units in the storage unit array to a first voltage; and
in a case where the data for performing the write operation on the storage units connected to the plurality of target wordlines is 1, regulate the voltage at the upper plates of the capacitors of all the storage units in the storage unit array to a second voltage;
wherein the first voltage is less than the second voltage.

16. A non-transitory computer-readable storage medium, having program programs stored thereon, the program programs, when executed by a processor, implementing steps of the memory detection method of claim 1.

* * * * *